(12) United States Patent
Kihara et al.

(10) Patent No.: US 7,217,462 B2
(45) Date of Patent: May 15, 2007

(54) METAL FOIL-CLAD LAMINATE

(75) Inventors: Shuta Kihara, Kanagawa (JP); Ko Kedo, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

(21) Appl. No.: 10/841,432

(22) Filed: May 10, 2004

(65) Prior Publication Data

US 2005/0037213 A1 Feb. 17, 2005

(30) Foreign Application Priority Data

May 9, 2003 (JP) .............................. 2003-131722
May 12, 2003 (JP) .............................. 2003-133357
May 19, 2003 (JP) .............................. 2003-139990

(51) Int. Cl.
*B32B 15/08* (2006.01)

(52) U.S. Cl. .................... 428/458; 428/473.5; 428/901

(58) Field of Classification Search ............ 428/473.5, 428/458, 901

See application file for complete search history.

(56) References Cited

U.S. PATENT DOCUMENTS 4,094,862 A * 6/1978 Bell ........................... 528/229
4,915,983 A * 4/1990 Lake et al. ................. 430/314
6,887,580 B2 * 5/2005 Tokuhisa et al. ........ 428/473.5

FOREIGN PATENT DOCUMENTS

JP 2002322274 A * 11/2002

* cited by examiner

Primary Examiner—Thao Tran
(74) Attorney, Agent, or Firm—Antonelli, Terry, Stout & Kraus, LLP.

(57) ABSTRACT

The metal foil-clad laminate of the present invention comprises at least one polyimide layer made of a polyimide having repeating units represented by the following formula I:

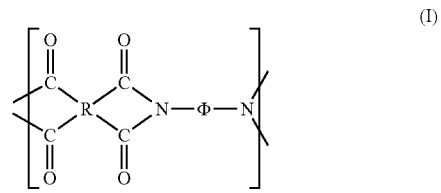

wherein R and Φ are as defined in the specification, at least one insulating substrate, and at least one metal foil layer. The polyimide is excellent in thermopress-bonding property, solubility in solvents and heat resistance, and exhibits a low dielectric constant. The metal foil-clad laminate having the polyimide layer is suitably applicable to high-frequency printed wiring boards, etc.

19 Claims, No Drawings

METAL FOIL-CLAD LAMINATE

BACKGROUND OF THE INVENTION

1. Field of the Invention

The present invention relates to a metal foil-clad laminate using a low dielectric polyimide having a good heat resistance and a good adhesion property. The metal foil-clad laminate is applicable to printed wiring boards, surface heating elements, electromagnetic shielding materials, flat cables, etc.

2. Description of the Prior Art

Some metal foil-clad laminates are produced by bonding an insulating substrate and a metal foil through an adhesive or an adhesive film. For example, there has been proposed a meta foil-clad laminate having a three-layered structure which is formed by bonding an aromatic polyimide film as an insulating substrate to a metal foil through an adhesive film (e.g., Japanese Patent Application Laid-Open No. 55-91895).

Hitherto, epoxy-based or acryl-based adhesives have been mainly used as the adhesive or adhesive film. However, since these resins are poor in heat resistance, products obtained using these adhesives show an insufficient heat resistance, resulting in limitations to subsequent processing conditions and use conditions.

Under these circumstances, there is a demand for adhesives and adhesive films having an excellent heat resistance. For example, there is disclosed a method of forming a thermopress-bonding adhesive layer on an insulating substrate by applying a polyimide or polyamic acid dispersion on the substrate as the adhesive and then removing the solvent, followed, if required, by imidation (e.g., Japanese Patent Application Laid-Open Nos. 5-32950 and 5-59344). Also, there is disclosed a method of forming a thermopress-bonding adhesive film by applying a resin dispersion on a glass plate, etc. and then removing the solvent, followed, if required, by imidation.

To the formed adhesive layer or adhesive film, an adherend such as metal foil is thermopress-bonded. (e.g., Japanese Patent Application Laid-Open Nos. 5-32950 and 5-59344 and Japanese Patent No. 3213079).

Further, there is known a method of forming an insulating protective film layer on a circuit surface of a printed wiring board by a liquid cover coat agent (a cover lay ink) or a cover lay film. In this method, a cover coat agent is applied to a circuit surface of a printed wiring board by a method such as screen printing and then subjected to a treatment such as curing to from a cover coat layer. However, since the conventional cover coat agents extensively used are mainly made of epoxy-based resins that are poor in heat resistance and flexibility, the printed wiring board having a cover coat also tends to be insufficient in heat resistance and flexibility, resulting in limitations to subsequent processing conditions and use conditions. Therefore, it has been demanded to provide cover coat agents having excellent heat resistance and flexibility. For example, there has been proposed a method of forming a cover coat layer on a circuit surface of a flexible printed wiring board by applying a dispersion of polyimide or polyamic acid in a dispersing medium such as solvent on the circuit surface and then removing the solvent, followed, if required, by imidation (e.g., Japanese Patent No. 2820497 and Japanese Patent Application Laid-Open No. 8-109259).

Polyimide films having an excellent heat resistance are frequently used as a cover lay film. However, many of the polyimide films themselves are less adhesive to require the use of additional epoxy-based or acryl-based adhesives that are poor in heat resistance, causing the same problems as described above. Thus, there is a demand for adhesive films that are excellent in both flexibility and heat resistance. For example, there has been proposed a method of forming a thermopress-bonding, adhesive cover lay film by applying a dispersion of polyimide or polyamic acid on a support for film formation such as a glass plate and a metal plate, and then removing the solvent, followed, if required, by imidation (e.g., Japanese Patent No. 3213079).

In the recent application fields such as information processing and telecommunications, transmission frequency or operating frequency of CPU becomes higher in order to transmit or process a large content of information data. Therefore, it is required to shorten the time delay of signal transmission rate by reducing the dielectric constant of a whole insulating layer including an adhesive layer and a cover coat layer in addition to making the insulating layer thinner. However, since the above conventional adhesive layers, adhesive films, cover coat layers and cover lay films are made of aromatic polyimides, the dielectric constant at 10 GHz unfavorably becomes as high as about 3.5, although varies depending upon the content of aromatic ring.

It has been known that the dielectric constant of a polymeric material can be generally reduced by using an aliphatic monomer. The inventors have produced various polyimides from non-aromatic tetracarboxylic dianhydrides. Examples of the non-aromatic tetracarboxylic dianhydride include aliphatic (chain) tetracarboxylic dianhydrides such as 1,2,3,4-butanetetracarboxylic dianhydride, and alicyclic tetracarboxylic anhydrides such as 1,2,3,4-cyclobutanetetracarboxylic dianhydride, 1,2,4,5-cyclopentanetetracarboxylic dianhydride and bicyclo[2.2.2]octa-7-ene-2,3,5,6-tetracarboxylic dianhydride. However, polyimides obtained from the aliphatic (chain) tetracarboxylic dianhydride have an extremely low heat resistance and are inapplicable to the processing such as welding, reducing its practical utility. On the other hand, polyimides obtained from the alicyclic tetracarboxylic anhydride have an improved heat resistance as compared to those obtained from the chain tetracarboxylic dianhydride. However, since polyimides obtained from 1,2,3,4-cyclobutanetetracarboxylic dianhydride have a low solubility to solvents, the application of a solution of such polyimides onto a metal foil, an insulating substrate or a support for film formation fails to form a polyimide film having a thickness sufficient for the use as the adhesive layer, cover coat layer of cover lay film. Although 1,2,4,5-cyclopentanetetracarboxylic dianhydride and bicyclo[2.2.2]octa-7-ene-2,3,5,6-tetracarboxylic dianhydride provide polyimides having a high solubility to solvents, the film obtained by applying the polyimide solution onto a metal foil, an insulating substrate or a support for film formation fails to have a flexibility, reducing the practical utility as the adhesive layer, cover coat layer and cover lay film.

SUMMARY OF THE INVENTION

An object of the present invention is to solve the problems encountered in the conventional adhesive layers and cover coat layers made of aromatic polyimides, and to provide a metal foil-clad laminate having an adhesive layer, a cover coat layer, a cover lay film, etc. made of a low dielectric polyimide that is capable of thermopress-bonding, solvent-soluble and excellent in heat resistance and adhesion property.

As a result of extensive studies in view of solving the above problems, the inventors have found that polyimides having repeating units with a specific alicyclic tetracarboxylic acid structure are capable of thermopress-bonding, are soluble in solvents and exhibit good heat resistance and adhesion property as well as a low dielectric constant, and that a metal foil-clad laminate produced using such polyimides exhibits extremely excellent properties. The present invention has been accomplished on the basis of this finding.

Thus, the present invention provides a metal foil-clad laminate comprising:

at least one polyimide layer made of a polyimide having repeating units represented by the following formula I:

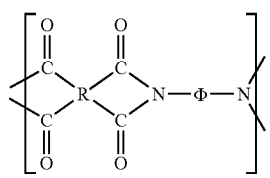

(I)

wherein R is a tetravalent group derived from cyclohexane; $\Phi$ is a $C_2$ to $C_{39}$ divalent aliphatic, alicyclic or aromatic group, or a combination of these divalent groups, with the proviso that at least one group selected from the group consisting of —O—, —SO$_2$—, —CO—, —CH$_2$—, —C(CH$_3$)$_2$—, —OSi(CH$_3$)$_2$—, —C$_2$H$_4$O— and —S— optionally intervenes in a main chain of $\Phi$;

at least one insulating substrate; and at least one metal foil layer.

The polyimide layer is formed by applying a solution of the polyimide (hereinafter occasionally referred to as "polyimide A") in organic solvent onto the insulating substrate, the metal foil layer or both thereof and then evaporating the solvent, or by disposing an adhesive polyimide film made of the polyimide A onto the insulating substrate, the metal foil layer or both thereof.

The polyimide layer may be disposed between the insulating substrate and the metal foil layer, or may be a cover coat layer or a cover lay film forming the surface layer of the metal foil-clad laminate. The polyimide layer forming the surface layer of the metal foil-clad laminate may be patterned by a wet etching method using an aprotic organic polar solvent as an etchant.

The polyimide A preferably has a glass transition temperature of 350° C. or lower, and a dielectric constant of 3.2 or less at 10 GHz.

DETAILED DESCRIPTION OF THE INVENTION

The polyimide used in the present invention has repeating units represented by the formula I:

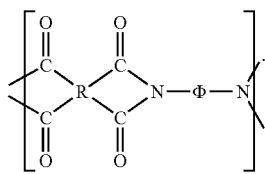

(I)

In the formula I, R is a tetravalent group derived from cyclohexane. $\Phi$ is a $C_2$ to $C_{39}$ divalent aliphatic, alicyclic or aromatic group, or a combination of these divalent groups. At least one group selected from the group consisting of —O—, —SO$_2$—, —CO—, —CH$_2$—, —C(CH$_3$)$_2$—, —OSi(CH$_3$)$_2$—, —C$_2$H$_4$O— and —S— optionally intervenes in a main chain of $\Phi$.

Examples of the preferred $\Phi$ include aliphatic groups such as polyalkylene, polyoxyalkylene, xylylene and alkyl- or halogen-substituted groups thereof; divalent alicyclic groups derived from cyclohexane, dicyclohexylmethane, dimethylcyclohexane, isophorone, norbornane and alkyl- or halogen-substituted compounds thereof and divalent aromatic groups derived from benzene, naphthalene, biphenyl, diphenylmethane, diphenyl ether, diphenyl sulfone, benzophenone and alkyl- or halogen-substituted compounds thereof. Specific examples of $\Phi$ include divalent groups represented by the following formulae:

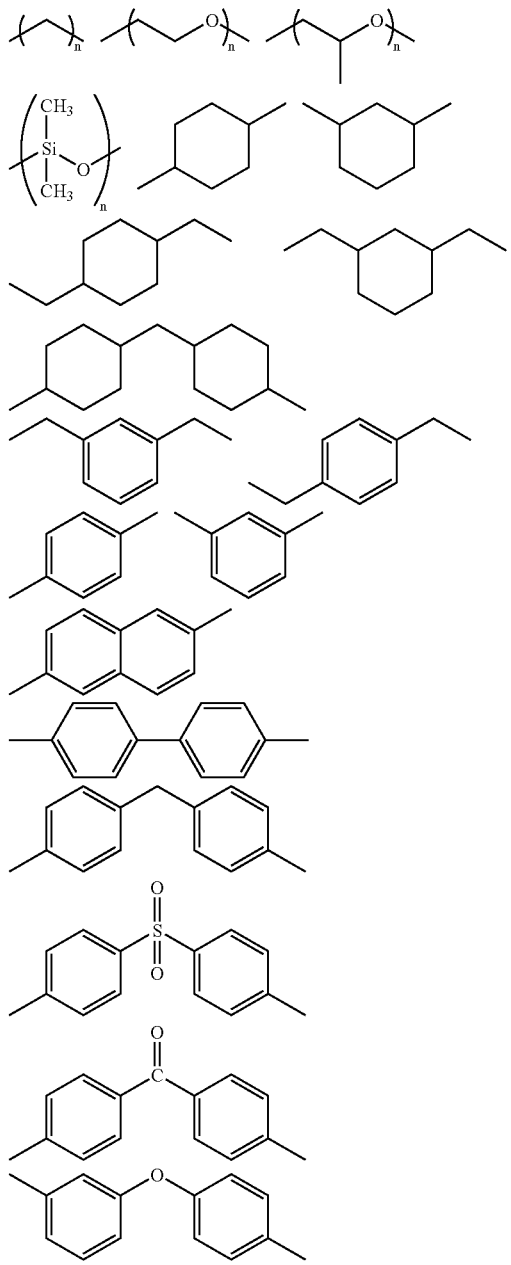

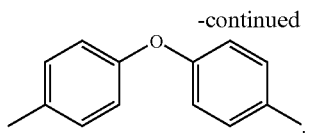

The content of the repeating unit represented by the formula I is preferably 10 to 100 mol % and more preferably 50 to 100 mol % of the total repeating units. The number of the repeating units represented by the formula I in one molecule of the polyimide is preferably 10 to 2000 and more preferably 20 to 200.

The polyimide A is produced by the reaction of a tetracarboxylic acid component with a diamine-related component (diamine and its derivatives). Examples of the tetracarboxylic acid components include cyclohexanetetracarboxylic acid, cyclohexanetetracarboxylic acid esters and cyclohexanetetracarboxylic dianhydrides, with cyclohexanetetracarboxylic dianhydrides being preferred. It should be noted that the tetracarboxylic acid components include various position isomers.

The polyimide A having a cyclohexanetetracarboxylic acid skeleton derived from the tetracarboxylic acid component is advantageous in view of obtaining a flexible film because its molecular weight is easily increased, and forming and processing the film because its solubility to solvents is sufficiently high. Also, the use of a coating solution containing the polyimide A as an adhesive or a cover coat agent advantageously facilitates the production of an adhesive layer or a cover coat layer that is flexible and has a sufficient thickness and durability.

The tetracarboxylic acid component may contain at least one compound selected from the group consisting of other tetracarboxylic acids and derivatives thereof unless the addition thereof adversely affects the solubility of the polyimide A to solvents, flexibility of resultant films, thermopress-bonding property and high-frequency properties. Examples of other tetracarboxylic acids and derivatives thereof include pyromellitic acid, 3,3',4,4'-biphenyltetracarboxylic acid, 2,3,3',4'-biphenyltetracarboxylic acid, 2,2-bis (3,4-dicarboxyphenyl)propane, 2,2-bis(2,3-dicarboxyphenyl)propane, 2,2-bis(3,4-dicarboxyphenyl)-1,1,1,3,3,3-hexafluoropropane, 2,2-bis(2,3-dicarboxyphenyl)-1,1,1,3,3,3-hexafluoropropane, bis(3,4-dicarboxyphenyl)sulfone, bis (3,4-dicarboxyphenyl)ether, bis(2,3-dicarboxyphenyl)ether, 3,3',4,4'-benzophenonetetracarboxylic acid, 2,2',3,3'-benzophenonetetracarboxylic acid, 4,4-(p-phenylenedioxy) diphthalic acid, 4,4-(m-phenylenedioxy)diphthalic acid, ethylenetetracarboxylic acid, 1,2,3,4-butanetetracarboxylic acid, 1,2,3,4-cyclobutanetetracarboxylic acid, 1,2,4,5-cyclopentanetetracarboxylic acid, 3-carboxymethyl-1,2,4-cyclopentanetricarboxylic acid, bicyclo[2.2.2]octa-7-ene-2,3,5,6-tetracarboxylic acid, dicyclohexyltetracarboxylic acid, 1,1-bis(2,3-dicarboxyphenyl)ethane, bis(2,3-dicarboxyphenyl) methane, bis(3,4-dicarboxyphenyl)methane and derivatives thereof.

Examples of the diamine-related component include diamines, diisocyanates and diaminodisilanes, with diamines being preferred. The content of the diamines in the diamine-related component is preferably 50 mol % or higher (inclusive of 100 mol %).

The diamine may be aliphatic diamines, aromatic diamines or mixtures thereof. In the present invention, the "aromatic diamine" means a diamine having amino groups directly bonded to aromatic ring, which may contain an aliphatic group, alicyclic group or another substituent in its structure. The "aliphatic diamine" means a diamine having amino groups directly bonded to an aliphatic or alicyclic group, which may contain an aromatic group or another substituent in its structure.

In general, when the aliphatic diamine is used as a component, it is rather difficult to obtain a high molecular polyimide, because the intermediate polyamic acid and the aliphatic diamine form a strongly bonded complex. Therefore, it is necessary to take suitable measures such as the use of a solvent having a relatively high dissolving power to the complex, for example, cresol. On the other hand, when the cyclohexanetetracarboxylic acid or its derivative is used together with the aliphatic diamine as constituting components, the molecular weight of the polyimide is easily increased, because the intermediate polyamic acid and the aliphatic diamine form a relatively weakly bonded complex.

Examples of the aliphatic diamines include 4,4'-diaminodicyclohexylmethane, ethylenediamine, hexamethylenediamine, polyethylene glycol bis(3-amonopropyl)ether, polypropylene glycol bis(3-aminopropyl)ether, 1,3-bis(aminomethyl)cyclohexane, 1,4-bis(aminomethyl)cyclohexane, m-xylylenediamine, p-xylylenediamine, isophoronediamine, norbornanediamine, and siloxanediamine.

Examples of the aromatic diamines include 4,4'-diaminodiphenyl ether, 4,4'-diaminodiphenylmethane, 4,4'-diaminodiphenyl sulfone, m-phenylenediamine, p-phenylenediamine, diaminobenzophenone, 2,6-diaminonaphthalene and 1,5-diaminonaphthalene.

In the present invention, the polyimide A is usually produced in the form of a solution in organic solvent. Examples of the organic solvents include N-methyl-2-pyrrolidone, N,N-dimethylacetoamide, N,N-dimethylformamide, dimethylsulfoxide, hexamethylphosphoramide, tetramethylenesulfone, p-chlorophenol, m-cresol and 2-chloro-4-hydroxytoluene.

The solution of the polyimide A in organic solvent is produced by the following methods (i) to (iii):

(i) After adding the tetracarboxylic acid component to an organic solvent solution of the diamine-related component or adding the diamine-related component to an organic solvent solution of the tetracarboxylic acid component, the resultant mixture is maintained preferably at 80° C. or lower and more preferably at about room temperature or lower for 0.5 to 3 h. After added with an azeotropic dehydrating solvent such as toluene and xylene, the resultant solution of the intermediate polyamic acid is subjected to dehydration while azeotropically removing the generated water out of the reaction system to obtain a solution of the polyimide A in organic solvent.

(ii) After imidating the intermediate polyamic acid by adding a dehydrating agent such as acetic anhydride into a solution of the polyamic acid, the polyimide A is precipitated by adding a poor solvent for the polyimide A such as methanol. The solid polyimide A separated by filtering, washing and drying is dissolved in a solvent such as N,N-dimethylacetamide to obtain a solution of the polyimide A in organic solvent.

(iii) A solution of the polyamic acid prepared by using a high-boiling solvent such as cresol is maintained at 150 to 220° C. for 3 to 12 h to allow the imidation to proceed. Then, the polyimide A is precipitated by adding a poor solvent for the polyimide A such as methanol. The solid polyimide A separated by filtering, washing and drying is dissolved in a solvent such as N,N-dimethylacetamide to obtain a solution of the polyimide A in organic solvent.

The concentration of the polyimide A in the organic solvent solution is preferably 5 to 50% by weight and more preferably 10 to 40% by weight.

In the present invention, the polyimide layer is formed by applying the organic solvent solution of the polyimide A which is produced by any of the above methods (i) to (iii) on a metal foil, etc., and then evaporating the solvent by heating. Alternatively, a polyimide film previously produced from the organic solvent solution can be used as the polyimide layer. In that case the polyimide film may be produced by applying the organic solvent solution of the polyimide A on a support for film production such as a glass plate and a metal plate, evaporating the solvent by heating at 200 to 350° C., and then separating the film from the support. Alternatively, the polyimide film may be produced by applying the organic solvent solution of polyamic acid on a support for film production, and then allowing the dehydrating imidation to proceed by heating at 200 to 350° C. The polyimide layer preferably has a thickness of 10 to 100 μm.

The polyimide A used in the present invention is extremely suitable as an insulating material, because the dielectric constant is low at high frequencies, and, in addition thereto, the frequency dependency of dielectric constant is small in the practically important frequency range of 1 to 20 GHz and the dielectric constant is substantially unchanged in the frequency range. The use of the aliphatic diamine is particularly preferred because a dielectric constant of 2.8 or lower at 10 GHz is achieved. However, even using the aromatic diamine, a dielectric constant of 3.2 or lower is achieved. The lowest dielectric constant to be achieved is usually 2.6. In addition, excellent high-frequency property of the polyimide A is proved by the characteristics that a dielectric loss tangent has a small frequency dependency and is substantially constant within the range of 0.008 to 0.018 in a frequency range of 1 to 20 GHz.

The polyimide film made of the polyimide A has a glass transition temperature of about 350° C. or lower although it varies depending upon the type of diamine used. The polyimide film exhibits its adhesion property at its glass transition temperature or higher although it varies depending upon the residual amount of solvent. If the glass transition temperature is too high, an excessively high thermopress-bonding temperature is correspondingly required. If the glass transition temperature is too low, the heat resistance of the film itself becomes insufficient. The glass transition temperature is preferably 200 to 350° C. and more preferably 250 to 320° C.

Examples of the material of the metal foil include copper, aluminum, stainless steel, gold, silver and nickel, with copper, aluminum and stainless steel being preferred. The thickness of the metal foil is not particularly limited and usually 5 to 100 μm in view of good processability.

Examples of the material of the insulating substrate usable in the present invention include polyimides, polybenzimidazole, polybenzoxazole, polyamides including aramid, polyether imides, polyamide imides, polyesters including liquid crystal polyesters, polysulfones, polyether sulfones, polyether ketones and polyether ether ketones, with polyimides, polybenzimidazole, polyamides including aramid, polyether imides, polyamide imides and polyether sulfones being preferred. The thickness of the insulating substrate is not particularly limited, and preferably 3 to 150 μm.

The metal foil-clad laminate of the present invention is produced by applying a polyimide A solution in organic solvent onto the insulating substrate or metal foil, evaporating the solvent to form an adhesive layer, and then thermopress-bonding an adherend such as an insulating substrate, a metal foil and a printed wiring board to the adhesive layer. Also, a polyimide A solution in organic solvent may be applied onto both surfaces of the insulating substrate, metal foil, etc., to form adhesive layers, and then an adherend may be thermopress-bonded to each of the adhesive layers. Further, a polyimide A solution in organic solvent may be impregnated into glass fiber fabric, carbon fiber fabric, etc.

More specifically, after applying the polyimide A solution in organic solvent onto the insulating substrate, the solvent is evaporated to form an adhesive layer. Then, the metal foil is stacked on the formed adhesive layer and continuously thermopress-bonded thereto using a pressure roll or the like to produce the metal foil-clad laminate. The polyimide A solution in organic solvent may be also used as an adhesive for cover lay films generally used. In this case, after applying the polyimide A solution in organic solvent onto a surface of the cover lay film, the solvent is removed to form an adhesive layer. Then, the cover lay film is thermopress-bonded to a printed wiring board having circuit patterns thereon using a heat-pressing machine to produce a metal foil-clad laminate.

In addition, the polyimide A solution in organic solvent may be also used as a cover coat agent. By applying the solution onto the circuit surface of a printed wiring board formed with circuit patterns and then evaporating the solvent by heating to 100 to 350° C., a metal foil-clad laminate having a polyimide A coat (cover coat layer) on the circuit surface is produced. With this method, a cover coat layer having a more sufficient thickness and flexibility, and a good adhesion to the circuit surface is formed.

Further, as described above, the polyimide A solution in organic solvent may be made into an adhesive polyimide film in advance. By thermopress-bonding the adhesive polyimide film to an adherend such as a metal foil, an insulating substrate and a printed wiring board, a metal foil-clad laminate is produced. For example, an aromatic polyimide film (insulating substrate) such as "Kapton" available from DuPont-Toray Co., Ltd., the adhesive polyimide film and the metal foil are continuously thermopress-bonded to each other using a pressure roll, etc., to produce a metal foil-clad laminate. Further, the adhesive polyimide film may be used to bond a printed wiring board and a general cover lay film. In addition, the adhesive polyimide film itself may be used as the adhesive cover lay film. In this case, for example, the adhesive cover lay film is thermopress-bonded to a printed wiring board using a thermoforming machine such as a hot press to produce a metal foil-clad laminate.

In any case of using the adhesive layer or the adhesive polyimide film each being formed from the polyimide A solution in organic solvent, the thermopress-bonding temperature is preferably 200 to 400° C. and more preferably 250 to 350° C. The thermopress-bonding pressure is preferably 0.1 to 200 kgf/cm$^2$ and more preferably 1 to 100 kgf/cm$^2$. The thermopress-bonding may be conducted under reduced pressure to remove the solvent or bubbles. By conducting the thermopress-bonding under the above conditions using the adhesive layer or the adhesive polyimide film, a very good adhesion strength is obtained.

The polyimide A used in the present invention is soluble in an aprotic organic polar solvent such as N-methyl-2-pyrrolidone, N,N-dimethylacetamide, N,N-dimethylformamide, dimethyl sulfoxide, hexamethylphosphoramide, tetramethyl sulfone, γ-butylolactone, propylene carbonate and dioxane. Therefore, the polyimide layer of the metal foil-clad laminates or the printed wiring boards formed with circuit patterns, which are produced by the methods described above, may be patterned by a wet-etching method using the aprotic organic polar solvent as an etchant. The formation of viaholes or flying leads and the removal of a cover coat over terminals are considerably facilitated as compared to the conventional patterning methods by dry-etching, resulting in the considerable improvement in productivity. The polyimide film of the present invention finds other various applications such as a limited exposure of specific portion of circuit and a limited plating of the exposed portion with a noble metal.

The present invention will be described in more detail below with reference to the following examples. However, these examples are only illustrative and not intended to limit the invention thereto.

Polyimide films and copper-clad laminates obtained in the examples and comparative examples were evaluated by the following methods.

(1) Dielectric Constant and Dielectric Loss Tangent

Measured by a cavity resonator perturbation method using a dielectric constant/dielectric loss tangent measuring apparatuses "CP431/461/501//531" available from Kanto Electronics Application & Development Inc.

(2) Glass Transition Temperature

Determined by DSC measurement at a temperature rise rate of 10° C./min using a differential scanning colorimeter "DSC-50" available from Shimadzu Corporation.

(3) Adhesion Strength

Measured according to JIS C 6481.

REFERENCE EXAMPLE

Production of 1,2,4,5-cyclohexanetetracarboxylic dianhydride

A 5-L Hastelloy (H22) autoclave was charged with 552 g of pyromellitic acid, 200 g of a catalyst, rhodium carried on activated carbon, available from N.E. Chemcat Corporation, and 1656 g of water. The inner atmosphere of the reactor was replaced with nitrogen gas under stirring. After replacing the inner atmosphere of the reactor with hydrogen gas, the hydrogen pressure was adjusted to 5.0 MPa and the temperature was raised to 60° C. While maintaining the hydrogen pressure at 5.0 MPa, the reaction was allowed to proceed for 2 h. Then, after replacing the hydrogen gas with nitrogen gas, the reaction product solution taken out of the autoclave was filtered while it was still hot to separate the catalyst. The filtrate was concentrated by evaporating water under reduced pressure using a rotary evaporator to precipitate crystals. The precipitated crystals were separated by solid-liquid separation and dried to obtain 481 g of 1,2,4,5-cyclohexanetetracarboxylic acid (yield: 85.0%).

Successively, 450 g of the obtained 1,2,4,5-cyclohexanetetracarboxylic acid and 4000 g of acetic anhydride were charged into a 5-L glass separable flask equipped with a Dimroth condenser. The inner atmosphere of the reactor was replaced with nitrogen gas under stirring. The temperature was raised to the refluxing temperature of the solvent to allow the solvent to reflux for 10 min. Thereafter, the temperature was lowered to room temperature under stirring to precipitate crystals. The precipitated crystals were separated by solid-liquid separation and dried to obtain primary crystals. The mother liquor after separation was concentrated under reduced pressure using a rotary evaporator to precipitate crystals. The precipitated crystals were separated by solid-liquid separation and dried to obtain secondary crystals. In total of the primary and secondary crystals, 375 g of 1,2,4,5-cyclohexanetetracarboxylic dianhydride was obtained (yield of anhydration: 96.6%).

EXAMPLE 1

In a 500-mL five-necked flask equipped with a thermometer, a stirrer, a nitrogen inlet, a branched dropping funnel, a Dean-Stark trap and a condenser, 10.0 g (0.05 mol) of 4,4'-diaminodiphenyl ether was dissolved in 85 g of N-methyl-2-pyrrolidone as a solvent under a nitrogen gas flow. Into the resultant solution, 11.2 g (0.05 mol) of the solid 1,2,4,5-cyclohexanetetracarboxylic dianhydride produced in Reference Example was added in several portions over one hour at room temperature, and the stirring was continued for 2 h at room temperature. Then, 30.0 g of xylene as an azeotropic dehydrating solvent was added to the solution, and the temperature was raised to 180° C. to allow the reaction to proceed for 3 h, while azeotropically removing the generated water with xylene being allowed to reflux through the Dean-Stark trap. After three hours, it was confirmed that the water was no longer distilled. Then, the temperature was raised to 190° C. over one hour to recover 29.0 g of xylene by distillation. After lowering the inner temperature to 60° C. by air cooling, an organic solvent solution of polyimide was obtained. The obtained solution was applied onto a glass plate and heated for one hour on a hot plate at 90° C. to evaporate the solvent. The resultant film was separated from the glass plate to obtain a self-supporting film. The self-supporting film was fixed to a stainless steel jig and then heated in a hot air dryer at 220° C. for 2 h to further evaporate the solvent, thereby obtaining a 100 µm-thick light-brown flexible film. By IR spectrum analysis of the obtained film, the product was identified as a polyimide having repeating units represented by the following formula II:

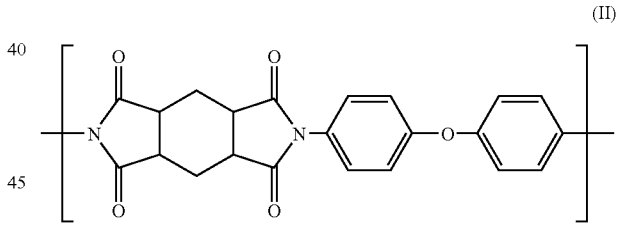

on the basis of the characteristic absorptions attributable to the imide ring at ν(C=O) 1772, 1700 cm$^{-1}$.

The glass transition temperature, dielectric constant and dielectric loss tangent of the film are shown in Tables 1 and 2.

The obtained organic solvent solution of polyimide was applied onto a 25 µm-thick commercially available polyimide film ("Kapton 100H" of 25 µm thick manufactured by DuPont-Toray Co., Ltd., hereinafter referred to as "Kapton 100H film") in a coating thickness of 200 µm using a doctor blade. By drying on a hot plate at 90° C. for one hour and drying in a hot air dryer at 220° C. for one hour, an adhesive layer having a thickness of 20 µm was formed. To the adhesive layer, an electrolytic copper foil ("3EC-VLP" of 18 µm thick available from Mitsui Mining & Smelting Co., Ltd., hereinafter referred to as "3EC-VLP copper foil") was thermopress-bonded by a hot press at 330° C. for 30 min to obtain a copper-clad laminate. The adhesion strength is shown in Table 1. The adhesion property was good.

EXAMPLE 2

In a 500-mL five-necked flask of the same type as used in Example 1, 11.2 g (0.05 mol) of 1,2,4,5-cyclohexanetetracarboxylic dianhydride produced in Reference Example was dissolved in 40.0 g of N-methyl-2-pyrrolidone as a solvent. Into the resultant solution, a solution prepared by dissolving 10.5 g (0.05 mol) of 4,4'-diaminodicyclohexylmethane in 45.0 g of dimethylacetamide was added dropwise over 2 h through the dropping funnel. After completion of the dropwise addition, the mixture was heated to 90° C. and stirred for one hour. Then, 30.0 g of xylene as an azeotropic dehydrating solvent was added to the solution, and the temperature was raised to 180° C. to allow the reaction to proceed for 3 h, while azeotropically removing the generated water with xylene being allowed to reflux through the Dean-Stark trap. After three hours, it was confirmed that the water was no longer distilled. Then, the temperature was raised to 190° C. over one hour to recover 30.0 g of xylene by distillation. After lowering the inner temperature to 60° C. by air cooling, an organic solvent solution of polyimide was obtained. The obtained solution was applied onto a glass plate and heated for one hour on a hot plate at 90° C. to evaporate the solvent. The resultant film was separated from the glass plate to obtain a self-supporting film. The self-supporting film was fixed to a stainless steel jig and then heated in a hot air dryer at 220° C. for 2 h to further evaporate the solvent, thereby obtaining a 100 μm-thick colorless transparent flexible film. By IR spectrum analysis of the obtained film, the product was identified as a polyimide having repeating units represented by the following formula III:

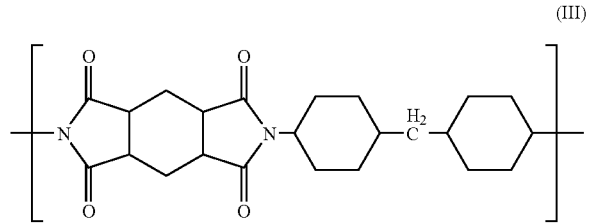

(III)

on the basis of the characteristic absorptions attributable to the imide ring at ν(C=O) 1764, 1691 cm$^{-1}$.

The glass transition temperature, dielectric constant and dielectric loss tangent of the film are shown in Tables 1 and 2.

The obtained organic solvent solution of polyimide was applied onto a 3EC-VLP copper foil in a coating thickness of 200 μm using a doctor blade. By drying on a hot plate at 90° C. for one hour and drying in a hot air dryer at 220° C. for one hour, an adhesive layer having a thickness of 20 μm was formed. To the adhesive layer, a Kapton 100H film was thermopress-bonded by a hot press at 280° C. for 30 min to obtain a copper-clad laminate. The adhesion strength is shown in Table 1. The adhesion property was good.

COMPARATIVE EXAMPLE 1

In a 500-mL five-necked flask of the same type as used in Example 1, 10.0 g (0.05 mol) of 4,4'-diaminodiphenyl ether was dissolved in 85.0 g of dimethylacetamide as a solvent. Into the resultant solution, 10.9 g (0.05 mol) of solid pyromellitic dianhydride was added over about one hour at room temperature under a nitrogen flow. After completion of the addition, the mixture was stirred at room temperature for 3 h to obtain a polyamic acid adhesive solution. The obtained adhesive solution was applied onto a glass plate, heated for one hour on a hot plate at 50° C. and then separated from the glass plate to obtain a self-supporting film. The self-supporting film was fixed to a stainless steel jig and then heated in a hot air dryer at 100° C. for 3 h, at 200° C. for 3 h, at 250° C. for 2 h, at 300° C. for one hour and then at 400° C. for one hour to further evaporate the solvent, thereby obtaining a 50 μm-thick brown flexible film. The glass transition temperature, dielectric constant and dielectric loss tangent of the film are shown in Table 1.

The polyamic acid adhesive solution was applied onto a Kapton 100H film in a coating thickness of 200 μm using a doctor blade. By drying for one hour on a hot plate of 50° C. and then imidating under heating in a hot air dryer at 100° C. for 3 h, at 200° C. for 3 h, at 250° C. for 2 h, at 300° C. for one hour and further at 400° C. for one hour, an adhesive layer of 15 μm thick was formed. To the adhesive layer, a 3EC-VLP copper foil was thermopress-bonded by a hot press at 350° C. for 30 min to obtain a copper-clad laminate. The adhesion strength is shown in Table 1. The adhesion property was poor.

TABLE 1

|  | Example 1 | Example 2 | Comp. Example 1 |
|---|---|---|---|
| Polyimide |  |  |  |
| tetracarboxylic acid component | CTDA | CTDA | PMDA |
| diamine-related component | ODA | DCHM | ODA |
| Thickness of polyimide layer (μm) | 20 | 20 | 15 |
| Glass transition temperature (° C.) | 315 | 261 | >400 |
| Dielectric constant at 10 GHz | 3.02 | 2.80 | 3.2 |
| Pressing conditions (min/° C.) | 30/330 | 30/280 | 30/350 |
| Adhesion strength (kgf/cm$^2$) | 1.58 | 1.50 | <0.5 |

Copper foil used: "3EC-VLP" available from Mitsui Mining & Smelting Co., Ltd. (thickness: 18 μm)
Polyimide film used: "Kapton 100H" available from DuPont Toray Co., Ltd. (thickness: 25 μm)
CTDA: 1,2,4,5-cyclohexanetetracarboxylic dianhydride
PMDA: pyromellitic dianhydride
ODA: 4,4'-diaminodiphenyl ether
DCHM: 4,4'-diaminodicyclohexylmethane

TABLE 2

| | Example 1 | |
|---|---|---|
| | Dielectric constant | Dielectric loss tangent |
| 1 GHz | 3.20 | 0.017 |
| 5 GHz | 3.10 | 0.017 |
| 10 GHz | 3.02 | 0.017 |
| 20 GHz | 3.00 | 0.015 |

EXAMPLE 3

The organic solvent solution of polyimide obtained in Example 2 was applied onto a Kapton 100H film in a coating thickness of 200 μm using a doctor blade. By drying for one hour on a hot plate of 90° C. and then drying in a hot air dryer at 220° C. for one hour, an adhesive layer of 20 μm thick was formed. The Kapton 100H film formed with the adhesive layer was stacked on the circuit surface of a copper foil/polyimide film two-layered flexible printed wiring board ("Vyloflex" available from Toyobo Co., Ltd.) as an adhesive cover lay film through the adhesive layer and then thermopress-bonded by a hot press at 280° C. for 30 min. The resultant copper-clad laminate with the cover lay film exhibited a sufficient flexibility and a good adhesion between the circuit surface and the cover lay film.

EXAMPLE 4

The organic solvent solution of polyimide obtained in Example 1 was applied onto a glass plate and heated for one hour on a hot plate at 90° C. to evaporate the solvent. The resultant film was separated from the glass plate to obtain a self-supporting film. The self-supporting film was fixed to a stainless steel jig and then heated in a hot air dryer at 220° C. for 2 h to further evaporate the solvent, thereby obtaining a 30 μm-thick light-brown, flexible, adhesive polyimide film. The obtained adhesive polyimide film was interposed between a 3EC-VLP copper foil and a Kapton 100H film and then thermopress-bonded by a hot press at 330° C. for 30 min to obtain a flexible copper-clad laminate. The adhesion strength of the flexible copper-clad laminate is shown in Table 3.

COMPARATIVE EXAMPLE 2

The polyamic acid adhesive solution obtained in Comparative Example 1 was applied onto a glass plate and heated for one hour on a hot plate at 90° C. to evaporate the solvent. The resultant film was separated from the glass plate to obtain a self-supporting film. The self-supporting film was fixed to a stainless steel jig and then heated in a hot air dryer at 100° C. for 3 h, at 200° C. for 3 h, at 250° C. for 2 h, at 300° C. for one hour and then at 400° C. for one hour to further evaporate the solvent, thereby obtaining a 30 μm-thick brown, flexible, adhesive polyimide film. The obtained adhesive polyimide film was interposed between a 3EC-VLP copper foil and a Kapton 100H film and then thermopress-bonded by a hot press at 330° C. for 30 min to obtain a flexible copper-clad laminate. The adhesion strength of the flexible copper-clad laminate is shown in Table 3.

TABLE 3

|  | Example 4 | Comp. Example 2 |
| --- | --- | --- |
| Polyimide |  |  |
| tetracarboxylic acid component | CTDA | PMDA |
| diamine-related component | ODA | ODA |
| Thickness of polyimide film (μm) | 18 | 18 |
| Glass transition temperature (° C.) | 315 | >400 |
| Dielectric constant at 10 GHz | 3.02 | 3.2 |
| Pressing conditions (min/° C.) | 30/330 | 30/350 |
| Adhesion strength (kgf/cm$^2$) | 1.58 | <0.5 |

Copper foil used: "3EC-VLP" available from Mitsui Mining & Smelting Co., Ltd. (thickness: 18 μm)
Polyimide film used: "Kapton 100H" available from DuPont-Toray Co., Ltd. (thickness: 25 μm)
CTDA: 1,2,4,5-cyclohexanetetracarboxylic dianhydride
PMDA: pyromellitic dianhydride
ODA: 4,4'-diaminodiphenyl ether

EXAMPLE 5

The organic solvent solution of polyimide obtained in Example 2 was applied onto a glass plate and heated for one hour on a hot plate at 90° C. to evaporate the solvent. The resultant film was separated from the glass plate to obtain a self-supporting film. The self-supporting film was fixed to a stainless steel jig and then heated in a hot air dryer at 220° C. for 2 h to further evaporate the solvent, thereby obtaining a 30 μm-thick colorless, transparent, flexible, adhesive polyimide film. The adhesive polyimide film as an adhesive cover lay film was thermopress-bonded to the circuit surface of a copper foil/polyimide film two-layered flexible printed wiring board "Vyloflex" by a hot press at 280° C. for 30 min. The resultant copper-clad laminate with the cover lay film exhibited a sufficient flexibility and a good adhesion between the circuit surface and the cover lay film.

EXAMPLE 6

The organic solvent solution of polyimide obtained in Example 1 was applied onto a glass plate and heated for one hour on a hot plate at 90° C. to evaporate the solvent. The resultant film was separated from the glass plate to obtain a self-supporting film. The self-supporting film was fixed to a stainless steel jig and then heated in a hot air dryer at 220° C. for 2 h to further evaporate the solvent, thereby obtaining a 30 μm-thick colorless, transparent, flexible, adhesive polyimide film. The adhesive polyimide film as an adhesive cover lay film was thermopress-bonded to the circuit surface of a copper foil/polyimide film two-layered flexible printed wiring board "Vyloflex" by a hot press at 330° C. for 30 min. The resultant copper-clad laminate with the cover lay film exhibited a sufficient flexibility and a good adhesion between the circuit surface and the cover lay film.

EXAMPLE 7

The organic solvent solution of polyimide obtained in Example 1 as a cover coat agent was applied onto the circuit surface of a copper foil/polyimide film two-layered flexible printed wiring board "Vyloflex" in a coating thickness of 200 μm using a doctor blade. By drying for one hour on a hot plate of 90° C. and then drying in a hot air dryer at 220° C. for one hour, a cover coat layer of 30 μm thick was formed. The cover coat layer exhibited a sufficient flexibility and a good adhesion to the printed wiring board.

EXAMPLE 8

The organic solvent solution of polyimide obtained in Example 2 as a cover coat agent was applied onto the circuit surface of a copper foil/polyimide film two-layered flexible printed wiring board "Vyloflex" in a coating thickness of 200 μm using a doctor blade. By drying for one hour on a hot plate of 90° C. and then drying in a hot air dryer at 220° C. for one hour, a cover coat layer of 30 μm thick was formed. The cover coat layer exhibited a sufficient flexibility and a good adhesion to the printed wiring board.

COMPARATIVE EXAMPLE 3

The polyamic acid adhesive solution obtained in Comparative Example 1 as a cover coat agent was applied onto the circuit surface of a copper foil/polyimide film two-layered flexible printed wiring board "Vyloflex" in a coating thickness of 200 μm using a doctor blade. By drying for one hour on a hot plate of 50° C. and then imidating under heating in a hot air dryer at 100° C. for 3 h, at 200° C. for 3 h, at 250° C. for 2 h, at 300° C. for one hour and further at 400° C. for one hour, a cover coat layer was formed. The cover coat layer was not closely bonded to the printed wiring board, showing an insufficient strength.

COMPARATIVE EXAMPLE 4

The polyamic acid adhesive solution obtained in Comparative Example 1 was applied onto a glass plate and heated for one hour on a hot plate at 90° C. to evaporate the solvent. The resultant film was separated from the glass plate to obtain a self-supporting film. The self-supporting film was fixed to a stainless steel jig and then heated in a hot air dryer at 100° C. for 3 h, at 200° C. for 3 h, at 250° C. for 2 h, at 300° C. for one hour and then at 400° C. for one hour to further evaporate the solvent, thereby obtaining a 30 μm-thick brown, flexible, adhesive polyimide film. The adhesive polyimide film as an adhesive cover lay film was thermopress-bonded to the circuit surface of a copper foil/polyimide film two-layered flexible printed wiring board "Vyloflex" by a hot press at 280° C. for 30 min. The cover lay film was not closely bonded to the printed wiring board, showing an insufficient strength.

EXAMPLE 9

The adhesive polyimide film obtained in Example 4 was interposed between a circuit surface of an epoxy resin rigid printed wiring board with a glass cloth substrate ("NEMA: FR-4" available from Fujitsu Interconnect Technologies Limited) and a circuit surface of a copper foil/polyimide film two-layered flexible printed wiring board "Vyloflex" and thermopress-bonded by a hot press at 330° C. for 30 min to obtain a flexible, rigid copper-clad laminate. The flexible, rigid copper-clad laminate exhibited a good adhesion condition free from non-adhered portions such as bubbles.

EXAMPLE 10

The organic solvent solution of polyimide obtained in Example 1 as a cover coat agent was applied onto a circuit surface of an epoxy resin rigid printed wiring board with a glass cloth substrate "NEMA: FR-4" in a coating thickness of 200 μm using a doctor blade. By drying for one hour on a hot plate of 90° C. and then drying in a hot air dryer at 220° C. for one hour, a cover coat layer of 30 μm thick was formed. The adhesion between the cover coat layer and the printed wiring board was good.

EXAMPLE 11

The organic solvent solution of polyimide obtained in Example 1 was applied onto a glass plate and heated for one hour on a hot plate at 90° C. to evaporate the solvent. The resultant film was separated from the glass plate to obtain a self-supporting film. The self-supporting film was fixed to a stainless steel jig and then heated in a hot air dryer at 220° C. for 2 h to further evaporate the solvent, thereby obtaining two pieces of 30 μm-thick light-brown, flexible, adhesive polyimide films. The adhesive polyimide films as an adhesive cover lay films were thermopress-bonded to respective circuit surfaces of a copper foil/polyimide film double-sided, two-layered flexible printed wiring board "Vyloflex" by a hot press at 330° C. for 30 min to obtain a copper-clad laminate. The copper-clad laminate exhibited a sufficient flexibility and a good adhesion between the circuit surface of the printed wiring board and the cover lay film.

Then, an acrylic resist was applied onto both the surfaces of the cover-laid copper-clad laminate by a screen printing method, exposed to patterning light and then developed to form resist patterns. The laminate was immersed in a N-methyl-2-pyrrolidone bath at 80° C. for 10 min, removed from the bath and then washed with water. The laminate was then immersed in an aqueous resist stripping bath at 40° C. for 10 min, removed therefrom and then washed with water. By the above wet-etching procedure, the non-mask region of the cover lay was removed with a clear profile.

The insulating layer, such as an adhesive layer, an adhesive film, a cover coat layer and a cover lay film, of the metal foil-clad laminate according to the present invention exhibits a dielectric constant of 3.2 or lower at 10 GHz and a good adhesion property, and therefore, suitably applicable to high-frequency printed wiring boards.

The invention claimed is:

1. A metal foil-clad laminate comprising:
   at least one polyimide layer made of a polyimide having repeating units represented by the following formula I:

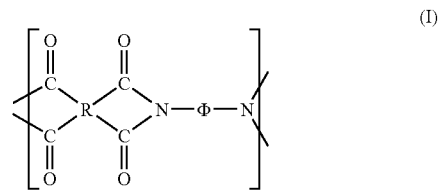

wherein R is a cyclohexyl group; Φ is a $C_2$ to $C_{39}$ divalent aliphatic, alicyclic or aromatic group, or a combination of these divalent groups, with the proviso that at least one group selected from the group consisting of —O—, —$SO_2$—, —CO—, —$CH_2$—, $C(CH_3)_2$, —$OSi(CH_3)_2$—, —$C_2H_4O$— and —S— intervenes in a main chain of Φ;
   at least one insulating substrate; and
   at least one metal foil layer.

2. The metal foil-clad laminate according to claim 1, wherein the polyimide layer is formed on a surface of at least one of the insulating substrate and the metal foil layer.

3. The metal foil-clad laminate according to claim 1, wherein the polyimide layer is disposed between the insulating substrate and the metal foil layer.

4. The metal foil-clad laminate according to claim 1, wherein the polyimide layer is an adhesive layer formed by applying a solution of the polyimide in an organic solvent onto a surface of at least one of the insulating substrate and the metal foil layer, and then evaporating the solvent.

5. The metal foil-clad laminate according to claim 1, wherein the polyimide layer is an adhesive polyimide film made of the polyimide.

6. The metal foil-clad laminate according to claim 1, wherein the polyimide layer is a surface layer of the metal foil-clad laminate.

7. The metal foil-clad laminate according to claim 6, wherein the polyimide layer is a cover coat layer formed by applying a solution of the polyimide in an organic solvent and then evaporating the solvent.

8. The metal foil-clad laminate according to claim 6, wherein the polyimide layer is a cover lay film made of the polyimide.

9. The metal foil-clad laminate according to claim 6, wherein the polyimide layer is patterned by a wet etching method using an aprotic organic polar solvent as an etchant.

10. The metal foil-clad laminate according to claim 1, wherein the polyimide layer is disposed between the insulating substrate and the metal foil layer, and is an adhesive layer that is formed by applying a solution of the polyimide in an organic solvent and then evaporating the solvent or an adhesive polyimide film made of the polyimide.

11. The metal foil-clad laminate according to claim 1, wherein the insulating substrate and the metal foil layer constitute a printed wiring board, and the polyimide layer is disposed on a circuitry surface of the printed wiring board.

12. The metal foil-clad laminate according to claim 11, further comprising another insulating substrate disposed on the polyimide layer.

13. The metal foil-clad laminate according to claim 11, further comprising a printed wiring board disposed on the polyimide layer.

14. The metal foil-clad laminate according to claim 1, wherein the polyimide has a glass transition temperature of 350° C. or lower.

15. The metal foil-clad laminate according to claim 1, wherein the polyimide has a dielectric constant of 3.2 or less at 10 GHz.

16. The metal foil-clad laminate according to claim 1, wherein said repeating units represented by the formula I are 10 to 100 mol % of the total repeating units of said polyimide.

17. The metal foil-clad laminate according to claim 1, wherein said repeating units represented by the formula I are 50 to 100 mol % of the total repeating units of said polyimide.

18. The metal foil-clad laminate according to claim 1, wherein said polyimide has 10 to 2000 repeating units represented by formula I.

19. The metal foil-clad laminate according to claim 1, wherein said polyimide has 20 to 200 repeating units represented by formula I.

* * * * *